United States Patent [19]

D'Alayer de Costemore D'Arc

[11] Patent Number: 4,827,458

[45] Date of Patent: May 2, 1989

[54] SOUND SURGE DETECTOR FOR ALERTING HEADPHONE USERS

[75] Inventor: Stephane M. D'Alayer de Costemore D'Arc, Genappe, Belgium

[73] Assignee: Staar S.A., Belgium

[21] Appl. No.: 168,454

[22] Filed: Mar. 15, 1988

[30] Foreign Application Priority Data

May 8, 1987 [BE] Belgium .............................. 08700500

[51] Int. Cl.$^4$ ................................................ H04R 3/00
[52] U.S. Cl. ...................................... 367/136; 381/57;
340/566
[58] Field of Search ................... 367/135, 136, 95, 96;
340/566; 381/57, 74, 56; 307/117; 455/344

[56] References Cited

U.S. PATENT DOCUMENTS

| 3,068,319 | 12/1962 | Fletcher et al. | 381/72 |
| 3,158,835 | 11/1964 | Hipkins | 381/24 |
| 3,271,520 | 9/1966 | Fletcher et al. | 367/2 |
| 4,088,836 | 5/1978 | Tech | 381/56 |
| 4,250,499 | 2/1981 | Kienzle | 367/136 |
| 4,475,230 | 10/1984 | Fukuyama et al. | 381/68 |
| 4,531,229 | 7/1985 | Coulter | 381/68 |
| 4,712,093 | 12/1987 | Reichel | 340/566 |

FOREIGN PATENT DOCUMENTS

| 3046862 | 6/1982 | Fed. Rep. of Germany . |
| 57-104312 | 6/1982 | Japan . |
| 58-190107 | 11/1982 | Japan . |
| 58-47308 | 3/1983 | Japan . |
| 59-11018 | 1/1984 | Japan . |
| WO86/03353 | 6/1986 | PCT Int'l Appl. . |

Primary Examiner—Thomas H. Tarcza
Assistant Examiner—Daniel T. Pihulic
Attorney, Agent, or Firm—Leydig, Voit & Mayer

[57] ABSTRACT

A sound reproducing system including a portable appliance reproducing sound from a recording and a transmission path transmitting reproduced sound to headphones worn by a user, and an apparatus for indicating to the user the occurrence of an abnormal event, causing a surge of ambient sound. The apparatus and a related method pick up ambient sound, transduce the ambient sound to an electrical signal, amplify the electrical signal, provide as a first output signal an envelope of the amplified signal, differentiate the first output signal, produce a second output signal with an amplitude which is a function of the slope of the first output signal, comparing the amplitude of the second output signal to a preset threshold level, and produce a control signal when the second output signal exceeds the threshold level indicating the occurrence of a surge in ambient sound having an amplitude, duration, and rising leading edge exceeding certain minimum characteristics, and indicating to the user the occurrence of an abnormal event through the transmission path.

15 Claims, 4 Drawing Sheets

SOUND SURGE DETECTOR FOR ALERTING HEADPHONE USERS

TECHNICAL FIELD

The present invention relates to an apparatus which monitors ambient sound level and, upon sensing the occurrence of a surge in sound, interrupts data transmission from a sound source to a receiver. More particularly, the invention relates to an electronic device which controls the attenuation level and/or generates a signal to interfere with the fidelity of sound reproduction emanating from a transmitter, for example, a cassette player, record player, or radio, and directed to a receiver, for example, a helmet or a pair of headphones.

BACKGROUND ART

In common use are many types of miniature portable appliances, such as cassette players, compact disc players, or credit card-sized radios, which, through a helmet or a pair of headphones, allow the user to listen to favorite music or programs anywhere and at anytime. Such appliances have enjoyed great success for several years but they have the major disadvantage of acoustically isolating the user from the surrounding environment, particularly since a large number of users prefer to listen at a very high volume. Although perfect acoustic isolation allows for listening comfort, such isolation could subject the user to a wide range of accidents or risks.

Indeed, it is observed everyday and in every environment, such as in parks, on highways, or in sports grounds, that the majority of users of portable appliances are, by virtue of their helmets or headphones, completely insensitive to calls, warning signals, and, above all, to any sudden, unexpected change in their surroundings. This drawback could have such severe consequences that, in many locales, the use of such appliances with helmets or headphones is strictly forbidden to drivers of vehicles, pedestrians, and others who are required to be alert to their surroundings.

Furthermore, it is unpleasant, when calling someone nearby who is wearing a helmet or headphones, to have to shout in order to warn the person of some danger or simply to attract the person's attention.

Consequently, the use of such appliances in public places or places which are heavily frequented is not recommended because it renders the users insensitive to calls or communications of general or safety interests. On the other hand, such appliances are frequently used in noisy environments, such as outside where cars, buses, or aircraft produce high ambient sound levels, or inside, where factory machinery, vacuum cleaners, air conditioning systems, and people talking produce high ambient sound levels.

DISCLOSURE OF THE INVENTION

The principal objective of the present invention is to remedy the aforesaid disadvantages by providing an apparatus by which the headphone user is alerted in a reliable manner upon the occurrence of a surge in sound representing an abnormal event or a warning of which the user should be made aware while minimizing false alerts in response to high sound levels that do not represent dangerous situations.

A second objective of the invention is to provide an inexpensive apparatus having a very small overall size which can be easily incorporated into miniature appliances or in the accompanying helmets or headphones or even partially in both.

Another object is to provide an apparatus with a built-in mechanism which generates a warning signal in an audible or visual form and maintains the signal for a predetermined period of time after it is generated.

A further object of the invention is to provide circuitry that accomplishes the predefined functions with minimum power consumption.

In order to carry out these objectives, the apparatus of the invention picks up ambient sound and, upon detection of a surge in sound having an amplitude above the average ambient level, determines the rate at which the surge in sound is changing which is considered an accurate and reliable representation of an abnormal event to which the user should be alerted.

BRIEF DESCRIPTION OF THE DRAWINGS

Further objects and advantages of the invention will be apparent from the following description taken in conjunction with the accompanying drawings, in which.

BEST MODE FOR CARRYING OUT THE INVENTION

Figure 1:
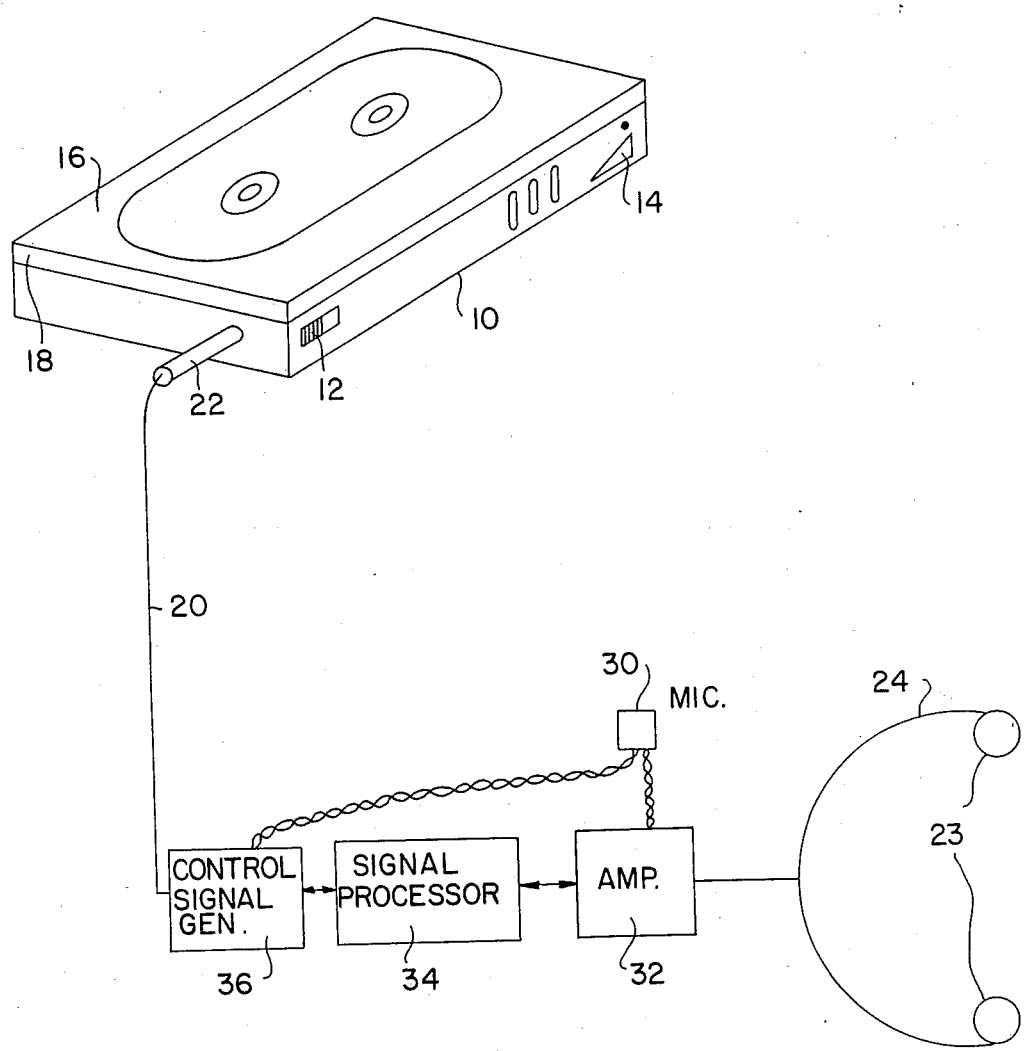
FIG. 1 is a perspective view of a portable appliance connected to headphones through circuit components shown in block diagram form.

FIG. 1 shows a conventional portable cassette player 10 provided with a milled wheel 12 by which volume can be regulated and a start-stop switch 14. A flap 16 pivoting about a spindle 18 makes it possible to insert or remove a magnetic tape cassette in the player 10. Connected to the player 10 via a lead 20 provided with a plug 22 are a pair of headphones 23 on a band or helmet 24. The cassette player 10 and headphones 23 are electronic system components currently available on the market which play and receive sound from recordings on a magnetic tape that are listened to by a user.

In accordance with the invention, electronic circuits are included in the lead 20 between the cassette player 10 and the headphones 23 which are operative when a user is listening to a recording through the headphones 23. When a surge in sound occurs above the ambient sound level which represents a dangerous situation or event about which the user should be informed, the electronic circuits generate a control signal which affects the transmission of sound to the headphones 23 and thereby alerts the user to the abnormal event or ocurrence. For this purpose and to carry out the invention, a microphone 30 is mounted at a location to receive sound from the surroundings. The microphone may be mounted on one of the components of the system, such as the helmet 24, one of the headphones 23, or the cassette player 10, as desired, as long as the location is adapted to pick-up sound from the surroundings. The microphone 30 transduces input ambient sound to an electrical signal which is fed to an amplifier 32, as illustrated in FIG. 1, which, in turn, is connected to a signal processor 34 and a control signal generator 36.

Figure 2A:
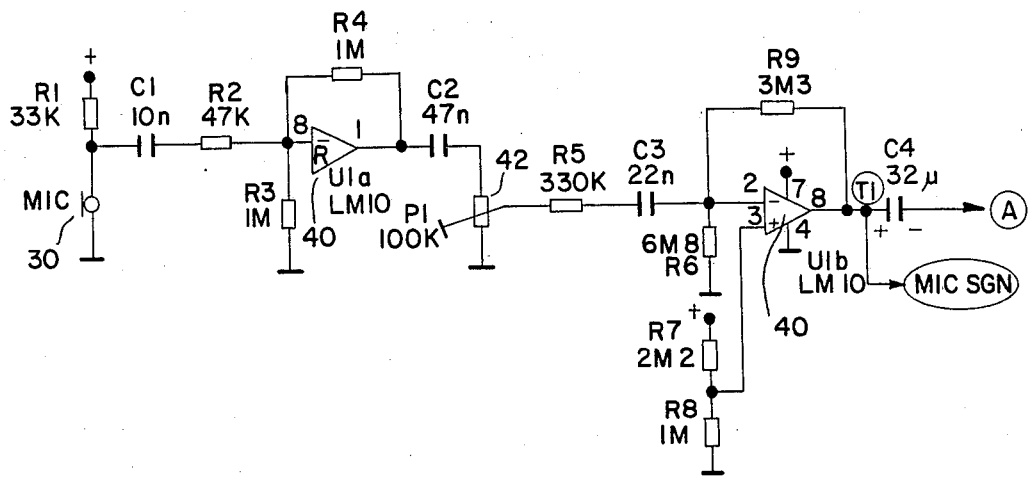
FIGS. 2A and 2B represent the electronic circuitry of different components of the apparatus.
Figure 3A:
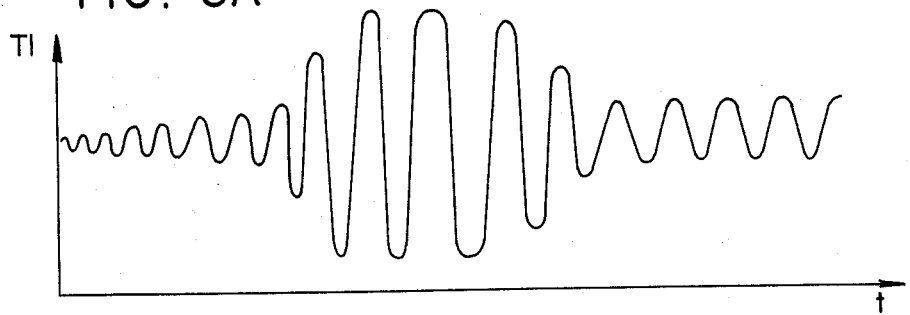
FIGS. 3A, 3B, 3C, and 3D represent diagrams of the electrical signals appearing at different points in the electronic circuits shown in FIGS. 2A and 2B.

With reference to FIG. 2A, it can be seen that the amplifier 32 is formed of an integrated circuit (IC) operational-amplifier 40, in this case preferably IC LM10 produced by National Semiconductor Company. The specifications and the application details of IC LM10 can be found in the catalogue entitled "Linear Elements", published by National Semiconductor Company. The resistors and capacitors disposed at the various terminals of this operational-amplifier 40 make it possible to adapt it to the conditions and purposes of the present invention. Amplification control is provided in the form of an adjustable potentiometer 42. The electrical signal obtained after amplification to enhance the signal-to-noise ratio can be measured at the point or node T1 in the form illustrated in FIG. 3A.

Figure 2B:
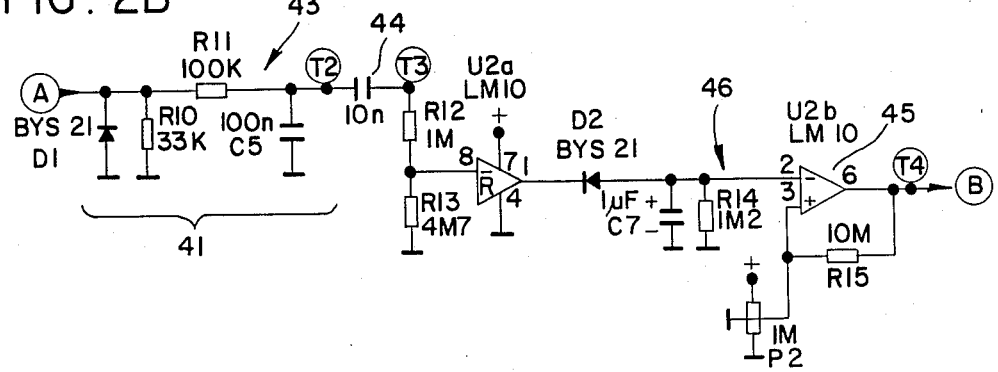

The output signal from the amplifier which appears at the node T1 is supplied to the circuitry shown in FIG. 2B which allows the detection of surges in sound above average ambient sound level. Thus, the circuitry shown in FIG. 2B produces a control signal output only when a surge in sound occurs that represents an abnormal event, the circuitry being effective to filter or screen out surges in sound which are too brief or too gradual to represent an event about which the user should be alerted.

To accomplish this, the circuit shown in FIG. 2B receives the electrical signal sensed and transduced by the microphone 30 after amplification at the terminal A. The first stage 41 of the circuitry shown in FIG. 2B is an envelope detector 43 which detects the envelope of the amplified signal and produces a first output signal which can be measured at point T2 as shown in FIG. 3B.

Figure 3B:
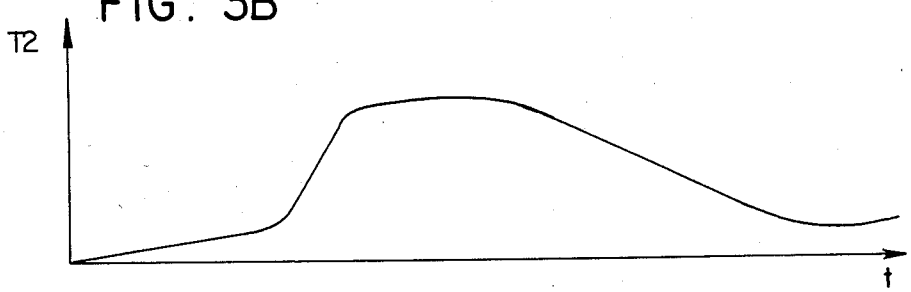
Figure 3C:
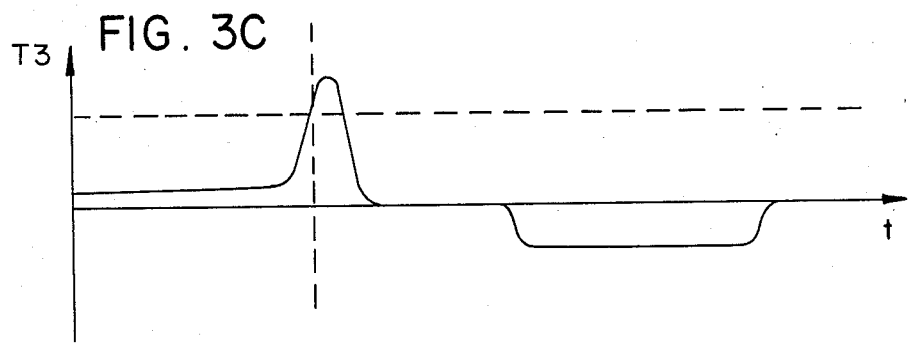

The first output signal is then processed by a differentiator, herein shown as capacitor 44, to obtain a second output signal measured at point T3 as shown in FIG. 3C which is a "derivative" of the curve shown in FIG. 3B and has an amplitude which is a function of the rate of change of the leading edge of the first output signal from the envelope detector 43. The amplitude of the second output signal thus represents the slope of the rising leading edge of the surge-representing amplified signal envelope.

Figure 3D:
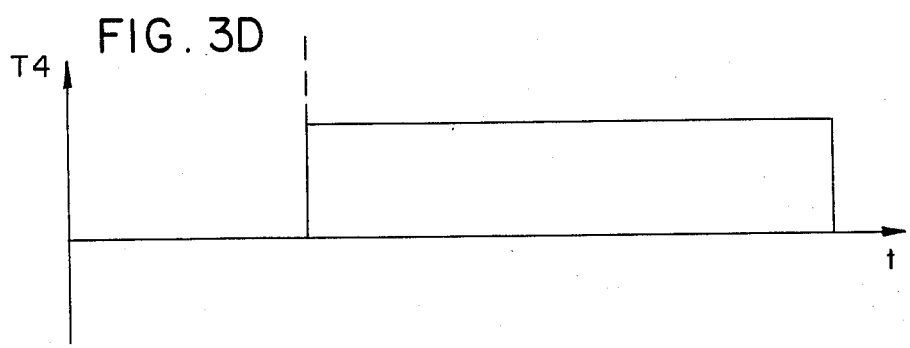

The second output signal is then applied to the input of a comparator 45 which is calibrated to a preset threshold, so labeled in FIG. 3C, the comparator 45 providing, at its output T4, a control signal, shown in FIG. 3D, when the amplitude of the second output signal applied at its output exceeds the preset threshold value. The control signal is maintained for a duration determined by timer circuitry which is shown in this case as RC circuit 46 in FIG. 2B. A control signal is provided at the output terminal B shown in FIG. 3B and is illustrated in FIG. 3D.

Consequently, a control signal is delivered when a surge above the average ambient sound level is detected, the surge having predetermined minimum characteristics, such characteristics including a minimum amplitude and duration and minimum slope of the rising leading edge of the surge-representing signal envelope. These minimum characteristics qualify a detected surge in sound as having been caused by an abnormal event about which a user of the system should be informed.

According to the invention, the rate at which the surge in sound is changing is a more accurate and reliable representation of an abnormal event than the amplitude of the surge alone. Thus, the circuitry according to the invention responds to a surge in sound above the average ambient level and determines the slope of the rising leading edge of the surge-representing signal envelope to respond to only sound surges of certain minimum characteristics. Sensitivity of the system to surges in sound and the minimum characteristics of amplitude and duration of the surge-representing signal envelope that result in a control signal are set by the adjustable potentiometer 42 and by the RC time constants of the amplification, envelope detection, and differentiation circuits.

Figure 4:
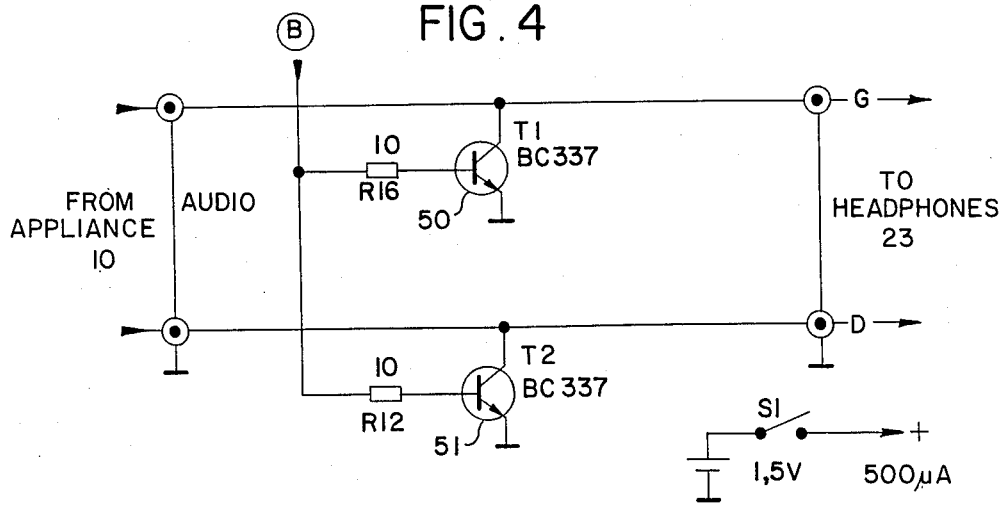
FIGS. 4 and 5 represent alternative embodiments of warning devices.

Two embodiments are illustrated which utilize the control signal to alert a user of the headphones 23 to an abnormal event. In the first embodiment, shown in FIG. 4, two transistors 50, 51, one for each audio channel between the cassette player 10 and the headphones 23, are supplied with the control signal appearing at the output terminal B in FIG. 2B. The transistors 50, 51 are operated to attenuate or cut-off the audio signal transmitted from the player 10 to the headphones 23 so that the user becomes aware of the surrounding conditions for a predetermined length of time. The predetermined length of time is determined by the duration of the control signal, which is a function of the RC time constant of the RC circuit 46, and turns the transistors 50, 51 on to attenuate or cut-off the audio signal upon the base of the transistors being driven by the control signal received from the terminal B. Alternatively, the control signal received from the terminal B may be utilized to activate a pulse or frequency generator, in place of the transistors 50, 51, the output from which is superimposed on the audio signal transmitted to the headphones 23 in such a manner as to warn or alert the user, the warning signal being maintained for a predetermined length of time.

Figure 5:
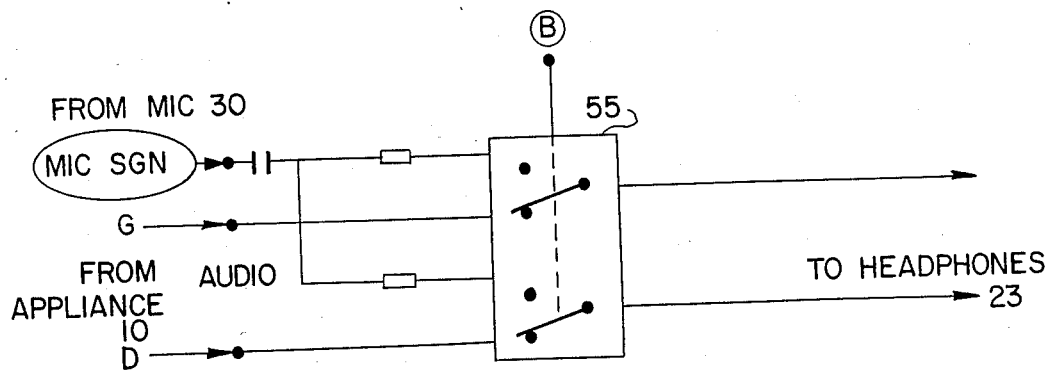

In another alternative embodiment illustrated in FIG. 5, the microphone 30 is connected through a circuit to the headphones 23 so that, responsive to a surge in sound, the output from the cassette player 10 is disconnected and the microphone output is directly connected to the headphones so that the user hears the ambient sound from the surroundings. For this purpose, as shown in FIG. 5, the control signal from the terminal B in FIG. 2B is utilized to operate a switching circuit 55 which disconnects the G and D audio channels from the cassette player 10 to the headphones 23 and connects into the same two channels the output of the microphone 30. Thus, the control signal gates the electrical signals detected by the microphone 30 after amplification (signal T1 in FIG. 2A) to the headphones 23 by means of the logic circuit diagrammed in FIG. 5 so that the user clearly hears the ambient sound through the microphone and headphones for a predetermined period of time.

These alternative embodiments discussed above may be combined in a single system.

Other alternatives of warning signals for alerting users may be used, such as modulated signals or interruption of the reproduction mode, without departing from the invention.

With regard to the construction of the circuitry and the location of the component parts, a wide range of alternatives exists. As previously noted, the microphone may be associated with the appliance, such as the cassette player, or with the helmet or one of the headphones. In the case of portable appliances provided with recording means, it is possible to use the microphone incorporated into the appliance and provided to pick up signals to be recorded in order to detect surges in sound in relation to the ambient sound level after the appliance is switched from the recording to the playback mode. To provide a most compact apparatus, the circuitry may be constructed entirely in integrated circuit form instead of in discrete circuits and components as shown.

The disclosed apparatus enables the user to listen to the ambient surroundings by generating an alert or control message, a process which is far simpler and faster than searching for the volume control of the player and turning down the sound volume and then restoring it to its original level, as is customary with existing appliances.

As will be appreciated, such an apparatus, with its simple and inexpensive construction, considerably enhances the safety of using helmets or headphones without hampering the user in any way. It ensures that the user is warned of any occurrence producing a surge in sound satisfying certain set criteria, as previously noted.

I claim:

1. In combination with a sound reproducing system transmitting reproduced sound along a transmission path to headphones worn by a user, an apparatus which detects a surge in ambient sound above an average ambient sound level and generates a control signal, said apparatus comprising:
    a transducer which transduces input ambient sound to an electrical signal;
    an amplifier connected to receive the electrical signal from said transducer and which provides an amplified signal;
    an envelope detector which provides a first output signal representing an envelope of the amplified signal;
    a differentiator which differentiates the first output signal and provides a second output signal having an amplitude which is a function of the rate of change of the first output signal;
    a comparator which compares the amplitude of the second output signal to a preset threshold level and produces a control signal when the second output signal exceeds the threshold level, thereby indicating the occurrence of a surge in ambient sound having an amplitude, duration, and a rising leading edge exceeding certain minimum characteristics; and
    a receiver having a device operable in response to the control signal to indicate to the user over the headphones the occurrence of a sound surge.

2. An apparatus according to claim 1 including a timing circuit determining the duration of the control signal.

3. An apparatus according to claim 1 wherein said amplifier includes an adjustable potentiometer and the minimum characteristics are set by said adjustable potentiometer and by RC time constants of circuits including said amplifier, envelope detector, differentiator, and comparator.

4. An apparatus according to claim 3 in which said receiver device is connected in the transmission path and attenuates the transmission of reproduced sound to the headphones in response to the control signal.

5. An apparatus according to claim 3 in which said receiver device is connected in the transmission path and transmits a warning signal to the user via the headphones in response to the control signal.

6. An apparatus according to claim 1 in which said sound reproducing system includes a portable appliance and wherein said transmission path comprises a lead connected between the appliance and the headphones.

7. An apparatus according to claim 1 in which said sound reproducing system includes a portable appliance having a recording microphone which serves as said transducer when the portable appliance is in a playback mode.

8. An apparatus according to claim 3 in which said transducer is located adjacent the headphones.

9. An apparatus according to claim 8 in which the headphones and said transducer are carried by a helmet.

10. An apparatus according to claim 1 wherein said amplifier includes a regulator to adjust the sensitivity of said amplifier to surges in sound.

11. In a reproducing system including a portable appliance reproducing sound from a recording and a transmission path transmitting reproduced sound to headphones worn by a user, a warning method to indicate the occurrence of an abnormal event to the user, which abnormal event causes a surge in ambient sound, said method comprising:
    picking up ambient sound and transducing ambient sound to an electrical signal;
    amplifying the electrical signal and providing as a first output signal an envelope of the electrical signal;
    differentiating the first output signal and producing a second output signal with an amplitude which is a function of the slope of the first output signal;
    comparing the amplitude of the second output signal to a preset threshold level and producing a control signal when the second output signal exceeds the threshold level, thereby indicating the occurrence of a surge in ambient sound having an amplitude, duration, and rising leading edge exceeding certain minimum characteristics; and
    indicating to the user the occurrence of an abnormal event through the transmission path when a control signal is produced.

12. A method according to claim 11 including generating the control signal for a predetermined length of time.

13. A method according to claim 11 in which the occurrence of an abnormal event is indicated to the user by attenuating the transmission or reproduced sound along the transmission path.

14. A method according to claim 11 in which the occurrence of an abnormal event is indicated to the user by superimposing a warning signal on the reproduced sound transmitted along the transmission path.

15. A method according to claim 11 including disconnecting the sound reproduced by the portable appliance from the transmission path, connecting input ambient sound into the transmission path, and transmitting the ambient sound to the headphones worn by the user.

* * * * *